United States Patent
Li et al.

(10) Patent No.: US 6,867,618 B2
(45) Date of Patent: *Mar. 15, 2005

(54) VOLTAGE MODE DIFFERENTIAL DRIVER AND METHOD

(75) Inventors: Ning Li, Fremont, CA (US); Jiann-Chyi (Sam) Shieh, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/747,310

(22) Filed: Dec. 30, 2003

(65) Prior Publication Data

US 2004/0150430 A1 Aug. 5, 2004

Related U.S. Application Data

(63) Continuation of application No. 10/084,365, filed on Feb. 28, 2002, now Pat. No. 6,686,772
(60) Provisional application No. 60/331,520, filed on Nov. 19, 2001.

(51) Int. Cl.$^7$ .......................................... H03K 19/0175
(52) U.S. Cl. ....................................... 326/83; 326/115
(58) Field of Search ............................ 326/82, 83, 86, 326/115, 30, 89, 90

(56) References Cited

U.S. PATENT DOCUMENTS

| | | | |
|---|---|---|---|
| 3,497,824 A | 2/1970 | Goordman | 330/30 |
| 5,767,698 A | 6/1998 | Emeigh et al. | |
| 5,942,940 A | 8/1999 | Dreps et al. | 330/253 |
| 6,028,467 A | 2/2000 | Burrows et al. | |
| 6,111,431 A * | 8/2000 | Estrada | 326/83 |
| 6,118,438 A | 9/2000 | Ho | |
| 6,232,815 B1 | 5/2001 | Turvey | |
| 6,252,435 B1 | 6/2001 | Wu et al. | |
| 6,275,107 B1 | 8/2001 | Maeda et al. | |
| 6,292,028 B1 * | 9/2001 | Tomita | 326/86 |
| 6,437,599 B1 | 8/2002 | Groen | |
| 2002/0131519 A1 | 9/2002 | Bu | 375/295 |
| 2002/0135404 A1 | 9/2002 | Payne et al. | |

FOREIGN PATENT DOCUMENTS

EP          938187          8/1999

OTHER PUBLICATIONS

"LVDS I/O Interface of Gb/s–per–Pin Operation in 0.35–$\mu$m CMOS" by Andrea Boni, Member, IEEE, Andrea Pierazzi, and Davide Vecchi; IEEE Journal of Solid–State Circuits, vol. 36, No. 4, Apr. 2001; pp. 706–711.

"Enhanced LVDS for Signaling on the RapidIO™ Interconnect Architecture", by Brian Young; Somerset Design Center, Motorola; pp. 17–20, Mar., 2000, IEEE, 0–7803–6450–3100.

IEEE Standard for Low–Voltage; Annex A, Annex B and Annex C, 1996.

* cited by examiner

*Primary Examiner*—Don Le
(74) *Attorney, Agent, or Firm*—Squire, Sanders & Dempsey L.L.P.

(57) ABSTRACT

A differential driver includes a switching module and first and second voltage controlled voltage sources. The switching module has a plurality of switches each controlled by an input signal, a first voltage input and a second voltage input, and a signal output. The first voltage controlled voltage source is connected to the first voltage input. The first voltage controlled voltage source has a low impedance. The second voltage controlled voltage source is connected to the second voltage input. The second voltage controlled voltage source also has a low impedance. The switching circuit outputs an output signal having an output voltage and current controlled by the first and second voltage controlled voltage sources. The output signal is based upon the input signal.

32 Claims, 6 Drawing Sheets

VOLTAGE MODE DIFFERENTIAL DRIVER AND METHOD

CROSS REFERENCE TO RELATED APPLICATIONS

This application claims priority from U.S. provisional application Ser. No. 60/331,520, filed Nov. 19, 2001, the contents of which are hereby incorporated by reference. This application is a continuation of U.S. Ser. No. 10/084,365, filed Feb. 28, 2002, issued as U.S. Pat. No. 6,686,772.

BACKGROUND OF THE INVENTION

1. Field of the Invention

The invention relates to input/output (I/O) interface circuitry for high speed data communications applications. More specifically the invention relates to low voltage differential signaling (LVDS) drivers, for use in the fields of communications, video and other integrated circuits that demand very high data transfer rates.

2. Description of the Related Art

Differential drivers are well known. Differential drivers are used in many input/output (I/O) applications such as in communications, video and integrated circuits that may demand high data transfer rate. Differential drivers are used in integrated circuits (IC) for on-chip communications between circuits, chip-to-board, off-chip communications, etc.

Low-voltage differential signaling (LVDS) technology was developed in order to provide a low-power and low-voltage alternative to other high-speed I/O interfaces specifically for point-to-point transmissions, such as those used in a network devices within data and communication networks. LVDS drivers can be implemented to overcome some deficiencies with previous I/O interface circuitry. However, the LVDS standard provides strict specifications for signal input and output characteristics, such as common mode voltage, differential voltage, etc.

In conventional I/O designs, high-speed data rates are accomplished with parallel I/O structures, each I/O device typically having a limited bandwidth. As bandwidth increases, more I/O devices are required to achieve the increased bandwidth. Over the years, bandwidth has increased substantially leading to massive parallelism in I/O designs in ICs. As a result, these parallel I/O structures occupy more and more space on ICs. This complicates the design of the circuits because there is less available space on the chip. The use of parallel structures also creates a need for additional supporting power supplies because of the numerous extra pads, current sources, etc. necessary in a parallel structure. Thus, most existing I/O drivers are not power efficient.

In portable devices, such as laptop computers, the power coming from the battery, low power allows for longer operating time. In the case where power is not restricted, such as in a desk top PC, power consumption is also important in IC. For example, if a CPU consumes more power, it will require an expensive package for the IC and possibly an additional cooling fan. Therefore, lower power means lower cost to the system.

Figure 1:
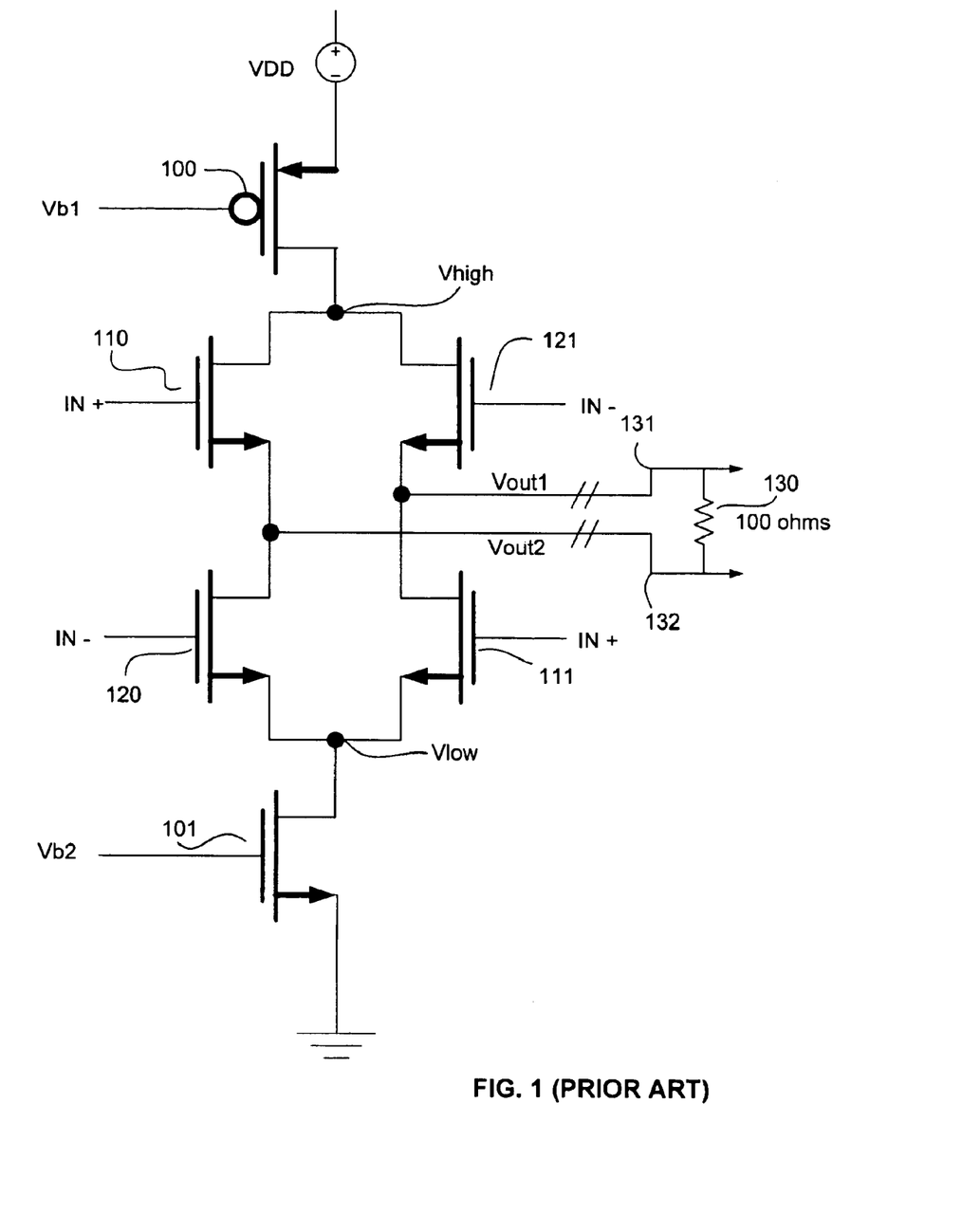
FIG. 1 is an illustration of a prior art LVDS driver.

A prior art LVDS driver is shown in FIG. 1. The metal oxide silicon (MOS) transistor 100 is represented with a circle at the gate indicating that it is a P-type MOS (PMOS) transistor. Transistors 101, 110, 111, 120 and 121 are N-type (NMOS) transistors. The driver includes two current sources 100 and 101, and four current switching NMOS transistors 110, 111, 120, and 121. PMOS transistor 100 provides current from VDD to the top switching transistors 110 and 121. A bias voltage Vb1 controls the amount of current following through the transistor 100. The bottom NMOS sinks current from the switching transistors 120 and 111 to ground (GND). A second bias, voltage Vb2, controls the current following through the transistor 101. Biasing this circuit is fairly easy, and bias voltages are typically provided using current mirrors.

In normal operation, only one group of switching can be on. In the case when transistors 110 and 111 are ON and 120 and 121 are OFF, the current from the current source 100 flows through the switching transistor 100 and follows to the load resistor 130. A voltage drop develops on the terminal of the resistor 130. Since, in this case, the current follows from bottom node 132 to top node 131, the bottom node 132 has a higher potential than the up node 131. The current on the top node 131 is sunk by current source 101 through the switching transistor 111. The current source 101 should sink the same amount of current as provided by current source 100, to get the common mode voltage correctly.

In the opposite case, when transistors 110 and 111 are OFF and transistors 121 and 121 are ON, current will create a voltage drop of a reversed polarity on the load resistor 130. In this case, the top node 131 has a higher potential than the bottom node 132.

There are two major drawbacks in this circuitry for high speed IC applications. First, operating speed is limited due to the high impedance design. Node Vhigh and node Vlow are high impedance nodes with relatively large parasitic capacitance, and therefore, are slow to respond. In high speed switching, these nodes also cause the common mode voltage to drift. A poorly designed current source, as an example, could have an impedance above a few kilo-ohms. Moreover, a well designed current source will have much higher impedance. Moreover, a well designed current source, such as cascoded current source, will have much high impedance.

Second, in a high speed serial interconnection, termination at the driver side may be required for good signal integrity. This circuit does not include terminal resistors, and therefore, has poor signal integrity at high speeds.

Figure 2:
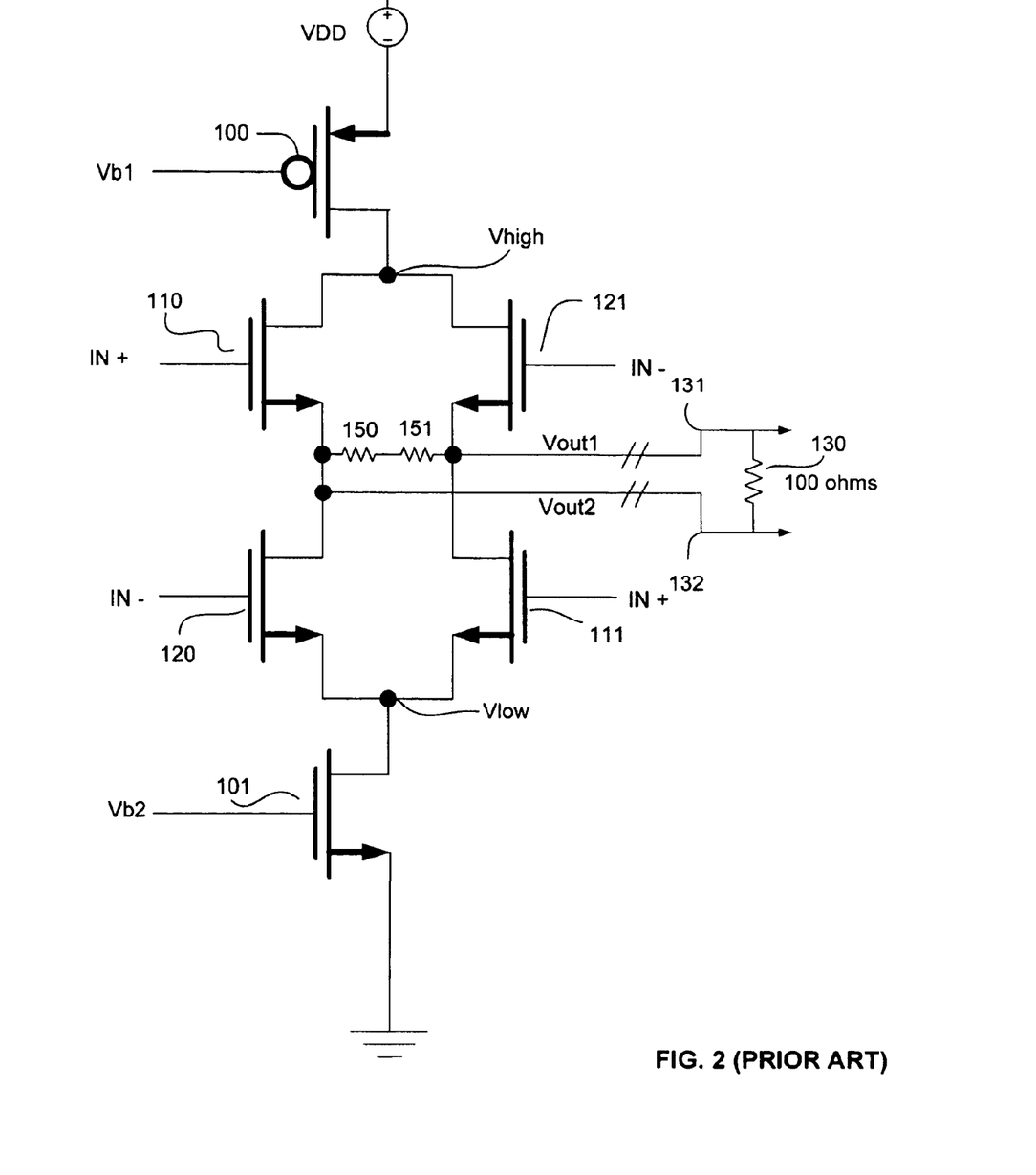
FIG. 2 is an illustration of a prior art LVDS driver having terminal resistors.

FIG. 2 shows another prior art implementation of an LVDS driver that has built-in termination resistors. The operation of the circuit is very similar to the first circuit, except the load is now shared with the resistors 150 and 151. The impedances at the current source 100 and 101 are very high and can be neglected compared to the termination resistor. To terminate the source properly, resistors 150 and 151 need to be half the resistance of the resistor 130. For a typical application, resistor 130 is 100 ohms. Thus, resistors 150 and 151 need to be 50 ohms each. In this design, the same amount of current will follow into resistors 150 and 151. The advantage of adding resistors 150 and 151 is that the impedance at Vhigh and Vlow are reduced for high speed operation. Also, since this reduces reflection in the transmission line, signal integrity is improved. However, the current efficiency of this driver is 50% because only 50% of the current generated flows to the load. Thus, this circuit design is deficient for having a low current efficiency.

In view of the deficiencies in the prior art, there is a need for new and improved systems and methods for driving LVDS in modern I/O applications.

SUMMARY OF THE INVENTION

According to an embodiment of the present invention, a differential driver is provided. The differential driver includes a switching module and first and second voltage controlled voltage sources. The switching module has a plurality of switches each controlled by an input signal, a first voltage input and a second voltage input, and a signal output. The first voltage controlled voltage source is connected to the first voltage input. The first voltage controlled voltage source has a low impedance. The second voltage controlled voltage source is connected to the second voltage input. The second voltage controlled voltage source also has a low impedance. The switching circuit outputs an output signal having an output voltage and current controlled by the first and second voltage controlled voltage sources. The output signal is based upon the input signal.

According to another embodiment of the present invention, a method of driving a signal is provided. The method includes a step of providing a switching module having a first and second voltage input, a signal input, and a signal output. The signal input is connected to a plurality of switches in order to control an operation of the switches. The signal output is connected to the first and second voltage inputs via the plurality of switches. The method also includes a step of providing a first voltage controlled voltage source having a first voltage output having a low impedance. The method also includes a step of providing a second voltage controlled voltage source having a second voltage output having a low impedance. The method also includes a step of connecting the voltage output of the first voltage controlled voltage source to the first voltage input of the switching module. The method also includes a step of connecting the voltage output of the second voltage controlled voltage source to the second voltage input of said switching module.

According to another embodiment of the present invention, a differential driver is provided. The differential driver includes a switching means and first and second voltage controlled voltage source means. The switching means is for switching a plurality of switches in order to produce a signal output based on an input signal, a first and second voltage input. The first voltage controlled voltage source means is for generating a first low impedance voltage output as the first voltage input to the switching means. The second voltage controlled voltage source means is for generating a second low impedance voltage output as the second voltage input to the switching means.

BRIEF DESCRIPTION OF THE DRAWINGS

The objects and features of the invention will be more readily understood with reference to the following description and the attached drawings, wherein.

DETAILED DESCRIPTION OF THE PREFERRED EMBODIMENTS

Figure 3:
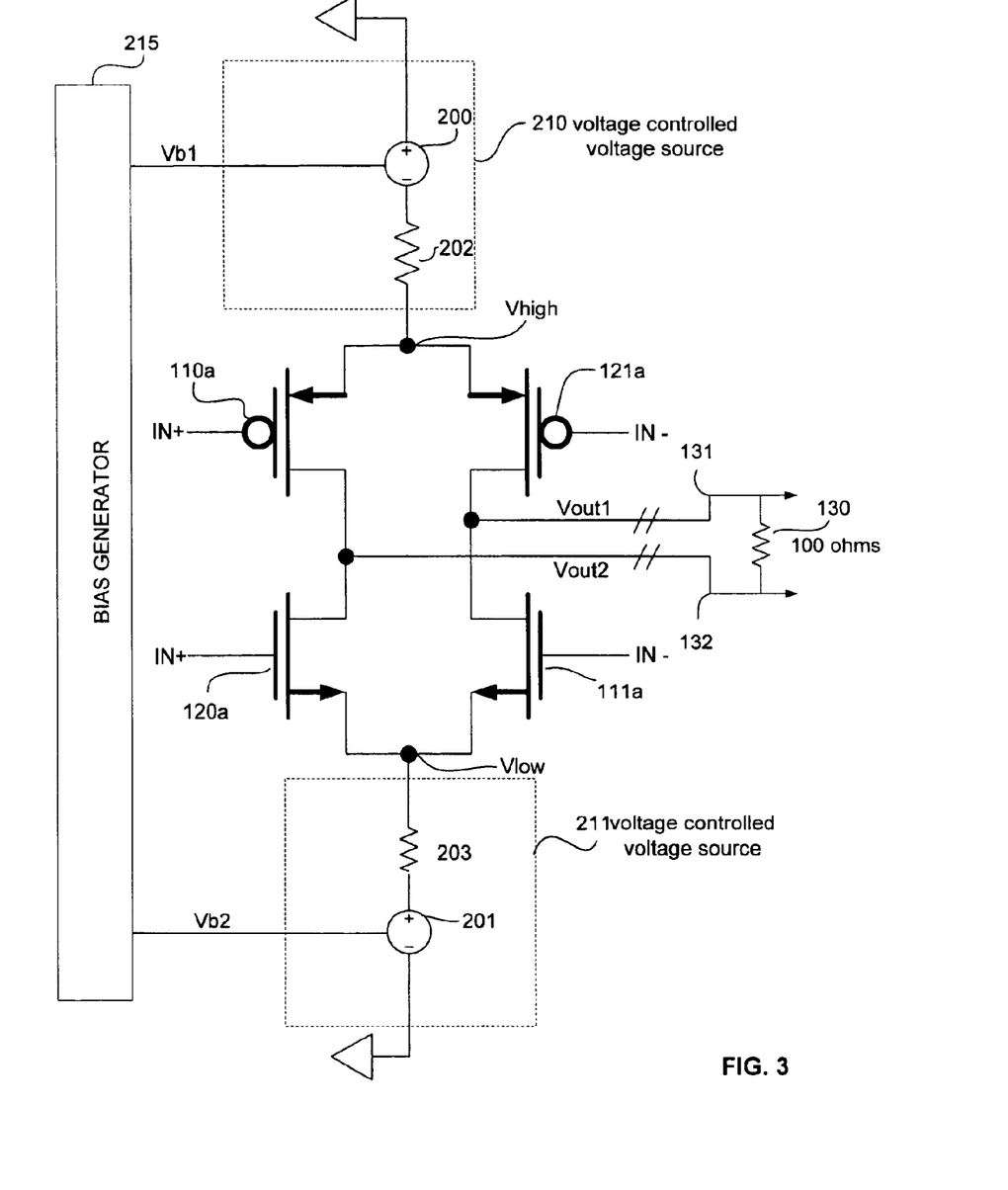
FIG. 3 is an illustration of a LVDS driver according to an embodiment of the present invention.

FIG. 3 is an illustration of a voltage mode differential driver according to an embodiment of the present invention.

The differential driver includes two Voltage Controlled Voltage Sources (VCVS) 210 and 211, which provide DC voltages to the nodes Vhigh and Vlow, respectively. The output impedance for voltage controlled voltage source 210 is modeled by a resistor 202 and is configured to be a low impedance in the range of a few hundred ohms, preferable around 30 ohms for a differential load of 100 ohms. Similarly, the output impedance for the voltage controlled voltage source 211 is modeled by resistor 203 and is similarly configured to be a low impedance. VCVS 210 and 211 are biased by bias voltages Vb1 and Vb2, respectively output by a bias generator 215.

The differential driver also includes a switching circuit having a plurality of switches for switching an output voltage (signal) based on an input signal. The switching circuit may include a pair of voltage inputs, at nodes Vhigh and Vlow, and series of switches. In this example, the switching circuit includes two pair of switching transistors 110a, 111a and 120a, 121a, which act as the switches. A signal output, Vout1 and Vout2, are output from the switching circuit to nodes 131 and 132 across a resistive load 130. Load 130 may typically be 100 ohms, but can vary depending on the application. Load 130 may be a differential load, and accordingly, may be grounded in the middle of the load. As a differential load, load 130 would include 50 ohms above the ground and 50 ohms below the ground. Output node 131 is connected to the drains of transistors 110a and 120a, and output node 132 is connected to the drains of transistors 121a and 111a.

In normal operation, only a single pair of switching transistors will be ON while the other is OFF, in order to allow a current to flow from VCVS 210 through the load 130 to VCVS 211. In the present embodiment, switching transistors 110a and 121a are PMOS transistors, and switching transistors 120a and 111a are NMOS transistors. PMOS transistors are used on the top of the switching circuit because the common mode voltage is around half of the supply voltage, or about 1.2V. The PMOS transistors could have a smaller size than that of NMOS transistors. If NMOS were used, the size would be very big comparatively, because of the Vgs required to turn the switching transistor completely ON. If NMOS transistors were used, then there is a risk of common mode voltage drifting, which will place the common mode voltage outside of the LVDS standard for LVDS applications.

An input signal is used to control the switching of the switching circuit. In order to turn the pair 110a, 111a ON and pair 120a, 121a OFF simultaneously, input signal IN+ is sent to transistor 110a while an inverted signal IN− is sent to transistor 111a to turn both transistors ON. Similarly, IN+ is sent to transistor 120a while inverted signal IN− is sent to transistor 121a to turn them both OFF. Therefore, the gates of transistors 110a and 120a may be connected, while the gates of 121a and 111a may be connected. In a preferred embodiment of the present invention, the differential driver is used in LVDS applications. In LVDS applications, IN+ may be 2.5V while IN− may be 0V.

The voltage drop across node Vhigh and Vlow is calculated by:

$$Vhigh-Vlow=I*(R(110a)+R(111a)+Rload),$$

where R(110a) and R(111a) are the ON resistance of transistors 110a and 111a, and I is the current required to be flowing through the load resistor. Of course, the current I at the load may be set to comply with the LVDS standard. The biasing and configuration of the VCVS 210 and 211 may likewise be adjusted in accordance with the LVDS standard or to obtain a desired output Vout2–Vout2. Accordingly, the voltage supplied at Vhigh and Vlow are calculated to provide the proper common mode voltage and current output to the load. Because this circuit has very low impedance at Vlow, and Vhigh, it is capable of high speed operation with high efficiency.

The switching circuit may also provides gain, and the differential driver may act as an amplifier to amplify the incoming signal. As described above, the gates of transistors 110a and 120a, hereafter referred to as G0, may be tied together, and the gates of transistors 111a and 121a, hereafter referred to as G1, may be tied together. The gain may be calculated by:

$$A(v/v)=[V(131)-V(132)]/[V(G0)-V(G1)]=[gm(110a)+gm(120a)]*R(130),$$

where gm(110a) and gm(120a) are the transconductance of transistors 110a and 120a. As an example, when there is a current of around 3 mA flowing into the load resistor 130, then gm(110a) or gm(120a) is typically around 15 millisiemens (mS). Thus, $$A(v/v)=(15\ mS+15\ mS)*100\ ohms=3\ V/V.$$

Here is an example when the incoming signal is 50 mV and the output signal would be 150 mV. Note that this is a small signal gain. In a preferred embodiment, the incoming signals are large signal (as opposed to small signal). The voltage swing across G0 and G1 may be 0 to 2.5V. Therefore, the output would be 7.5V if the output is not limited by the power supply. The results are that these four transistors are working in triode region (with gm much smaller than 15 mS), where the resistance between source and drain may be around 10 ohms. When the transistors are OFF, the resistance across drain and source are infinity, and when the transistors are ON, the resistance across the drain and source is only about 10 ohms. Therefore, the transistors may be referred to or replaced by switches.

An advantage of the embodiment illustrated in FIG. 3 is that it allows for low power consumption with high speed operation through the use source followers at nodes Vhigh and Vlow. The impedance looking into the source follower is significantly lower than if a current source were used. Thus, the nodes Vhigh and Vlow can be operated at high speed.

Figure 4:
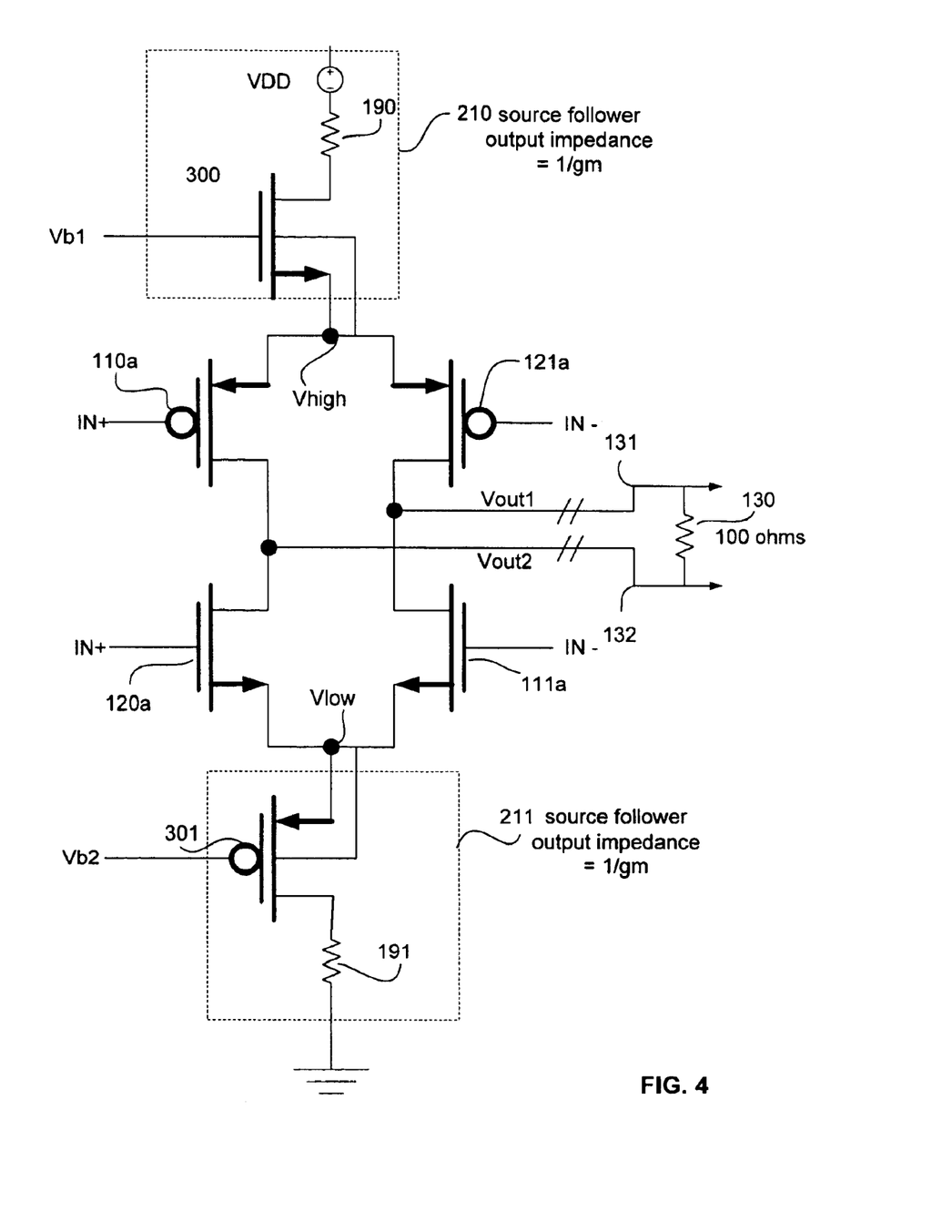
FIG. 4 is an illustration of a voltage mode differential driver according to another embodiment of the present invention.

FIG. 4 is an illustration of voltage mode differential driver according to another embodiment of the present invention. The differential driver includes VCVS 210 and VCVS 211, which provide DC voltages to the nodes Vhigh and Vlow, respectively, and a switching circuit.

VCVS 210 includes a transistor 300, which is implemented by an NMOS transistor in a source follower configuration. Similarly, VCVS 211 includes transistor 301, which is implemented by a PMOS transistor in a source follower configuration. Source followers provide significantly lower impedance looking into the source follower, i.e., at nodes Vhigh and Vlow, than that of a current source, such as shown in FIGS. 1–2. For example, in an LVDS application, a typical driver current I flowing to the load is 3 mA. When a 3 mA current flows in the transistors 300 or 301, the impedance looking into source is very low, and can be well below 50 ohms. Resistors 190 and 191 may be added to VCVS 210 and 211 to protect the differential driver from excessive current in the case of shorted terminals.

The switching circuit includes a pair of voltage inputs, connected at nodes Vhigh and Vlow, and two pair of switching transistors 110a, 111a and 121a, 122a, which act as the switches. In the present embodiment, switching transistors 110a and 121a are PMOS transistors, and switching transistors 120a and 111a are NMOS transistors. PMOS transistors are used on the top of the switching circuit because the common mode voltage is around half of the supply voltage, which is about 1.2V. The PMOS transistors could have a smaller size than that of NMOS. If NMOS were used, the size would be very big comparatively, because of the Vgs required to turn the switching transistor completely ON. Moreover, if NMOS transistors were used, then there is a risk of common mode voltage drifting, which will place the common mode voltage outside of the LVDS standard for LVDS applications. Vout1 and Vout2 are output from the switching circuit to nodes 131 and 132 across a resistive load 130, which may be a differential load as described above. Load 130 may typically be 100 ohms, such as in LVDS applications. Output node 131 is connected to the drains of transistors 110a and 120a, and output node 132 is connected to the drains of transistors 121a and 111a.

The source of transistor 300 is connected to node Vhigh, which provides voltage to the top of switching transistors 110a and 121a. The gate of transistor 300 is connected to bias voltage Vb1, the drain is connected to VDD through resistor 190, and the P-well is also connected node Vhigh. In normal process the substrate (P-well) is connected to ground by default. However, it is preferred that the substrate be connected to the source (node Vhigh) to reduce the body effect and lower the threshold voltage of the transistor. The lowering of the threshold voltage allows the MOSFET to be smaller for the same amount of current. Therefore, the area of the IC can be smaller and cost can be lower.

From gate to source, transistor 300 can have a voltage gain of 0.8 V/V–1.0 V/V, and also will have some DC level shifting (Vt+Vdsat in this case). Transistor 300 has a low impedance given by 1/gm, where gm is the transconductance of the source follower 300. The low impedance at node Vhigh allows faster response time at the node, and therefore, allows for better high-speed switching output from the differential driver at load 130.

Transistor 301 may be a PMOS transistor. The source of transistor 301 is connected to Vlow and provides solid low impedance voltage for the switching transistors 120a and 111a. The gate of transistor 301 is connected to bias voltage Vb2, the drain is connected to ground (GND) through resistor 191, and the N-well is preferably connected to source (node Vlow). Connecting the N-well to the source lowers the threshold voltage and provides more "headroom" for operating at low supply voltage.

Similar to that described above with reference to FIG. 3, in normal operation, only one pair of switching transistors are switched ON at a time. An input signal is used to control the switching of the switching circuit. In order to turn the pair 110a, 111a ON and pair 120a, 121a OFF simultaneously, input signal IN+ is sent to transistor 110a while an inverted signal IN– is sent to transistor 111a to turn both transistors ON. Similarly, IN+ is sent to transistor 120a while inverted signal IN– is sent to transistor 121a to turn them both OFF. Therefore, the gates of transistors 110a and 120a may be connected, while the gates of 121a and 111a may be connected. In a preferred embodiment of the present invention, the differential driver is used in LVDS applications. In LVDS applications, IN+ may be 2.5V while IN– may be 0V.

In the case where transistors 110a and 111a are ON and 121a and 120a are OFF, the transistor 300 provides a voltage Vhigh to drive a current through the MOS switch 110a to the load resistor 130, then through transistor 111a to the source of transistor 301. Similarly, when 110a and 111a are OFF and 121a and 120a are ON, the transistor 300 provides a voltage Vhigh to drive current through the MOS switch 121a to the load resistor 130, then through transistor 120a to the source of transistor 301.

Using source followers to provide voltage to the switching circuit requires proper biasing, especially in a low voltage or LVDS applications. The bias voltage Vb1 may be determined as follows:

$$Vb1=(Vhigh+Vtn+Vdsat),$$

where Vtn is the threshold voltage of the NMOS transistor 300, and Vdsat is the overdrive voltage for the NMOS transistor 300 when conducting a certain amount of current. Since the current flows from bottom node 132 to top node 131, the bottom node 132 has a higher potential than the up node 131. The PMOS transistor 301 provides a low voltage at node Vlow to sink current from the load resistor 130 through the transistor 111. The voltage drop at the load resistor (130), the required voltage difference of Vhigh and Vlow can be calculated as followed:

$$Vhigh-Vlow=I*[R(121a)+R(130)+R(120a)],$$

where R(121a), R(130) and R(120a) are the ON resistance of transistors 121a, 130 and 120a respectively. Transistors 110a and 121a may be provided to have identical sizes, and so may transistors 120a and 111a, and are preferably 20 ohms for a differential load of 100 ohms. Thus, the common mode voltage is calculated by $$(Vhigh+Vlow)/2,$$

since the resistance of transistors 121a and 120a are designed to be the same ideally. On the opposite case, when transistor 110a and 111a are OFF and transistor 121a and 120a are ON, the voltage drop on the load resistor 130 will be reversed polarity. The top node 131 has a higher potential than the bottom node 132.

Similar calculations can be made to determine the necessary bias voltage Vb2. In low voltage applications it may be desired to provide at least one voltage source greater than 1.2 volts in order to ensure that proper biasing of the circuit is obtained.

Similar to above, the driver of this embodiment may provide gain. Accordingly, the switching transistors and the power supplies may be configured to apply a small signal or large signal gain to the incoming signal. Furthermore, the switching transistors may be replaced by switches.

There are two major advantages in this implementation. First, as described above, node Vhigh and node Vlow are very low impedance nodes. Although the nodes have relatively large parasitic capacitance, they are fast to respond. Therefore, the differential driver is capable of high speed operations. Second, the driver may include built-in terminated resistance, for better signal integrity. To terminate the differential driver properly, the impedance of the driver needs to be the same as the transmission line. A typical transmission line has single ended 50 ohms impedance, thus the output impedance should be 50 ohms. Take the example when transistors 110a and 111a are closed. The MOS transistors 110a and 111a have impedances of R(110a) and R(111a), respectively. The impedance looking into source of the NMOS transistor 300 is 1/gm (300). Thus, to get a total impedance of 50 ohms, one should design R(110a)=50−1/gm (300) ohms. The same can be said for the PMOS side, transistor 301, and one should design R(111a)=50−1/gm (301) ohms. Therefore, if the load 130 is a differential load of 100 ohms, half the load (50 ohms) is mirrored by the top half of the driver (R(300)+R(110a or 121a)=50 ohms) and the other half of the load is mirrored by the bottom half of the driver (R(301)+R(111a or 120a)=50 ohms).

Because of the built-in termination resistance, the circuit does not need additional termination resistors in parallel with the load. Therefore the circuit in FIG. 4 can achieve 100% current efficiency, without wasting current in the passive termination resistors.

Figure 6:
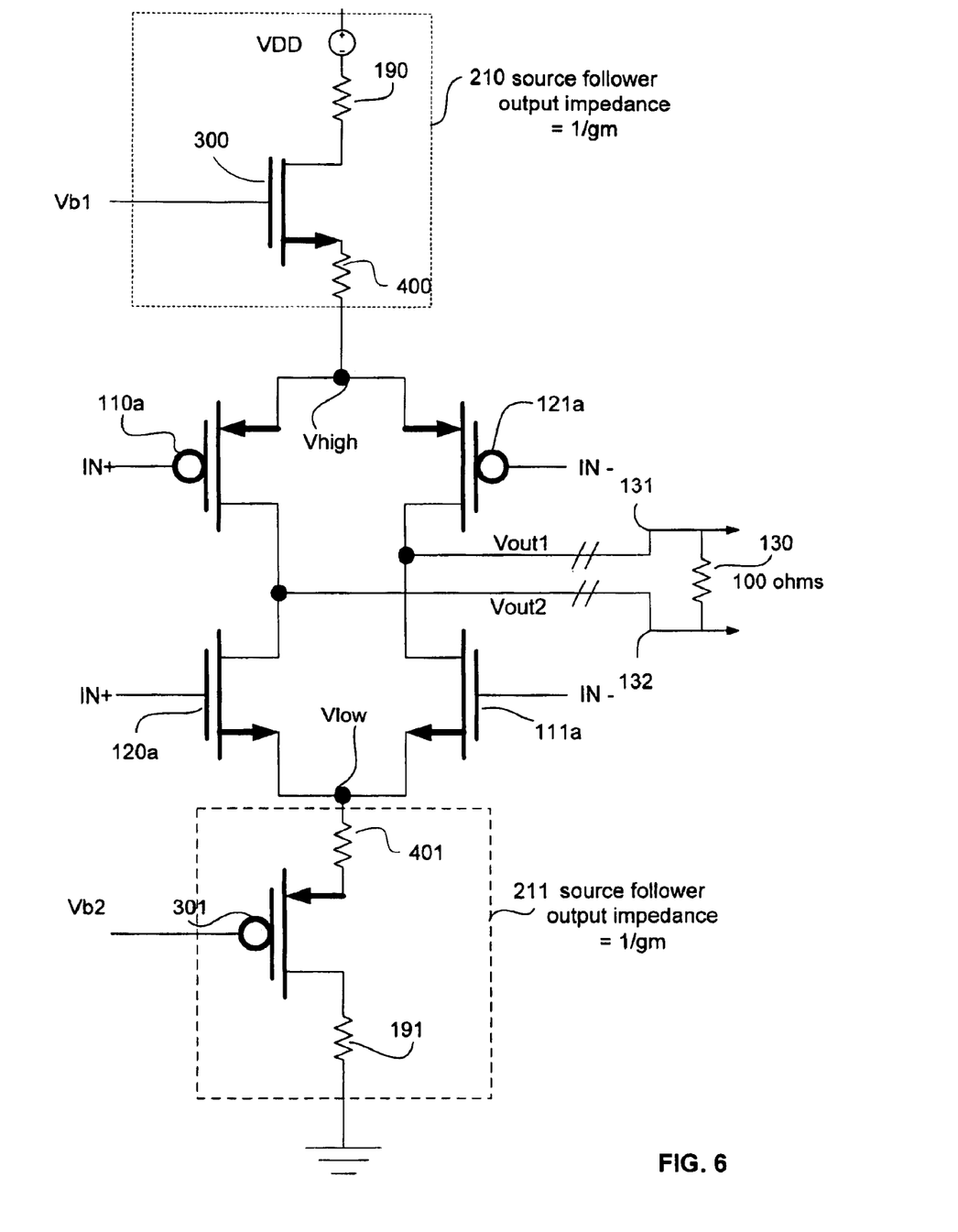
FIG. 6 is another embodiment of the present invention.

It should be noted that a more linearized output impedance may be provided by added a linear resistor between the source of each VCVS and the node Vhigh and Vlow, respectively. Accordingly, FIG. 6 shows linear resistors 400 and 401 added to VCVS 210 and 211, respectively. In this case, when 1/gm is small, the linear resistors can be added to get an output impendence of R(301)+R(111a or 120a)+R(400), and R(300)+R( 10a or 121a)+R(401).

Figure 5:
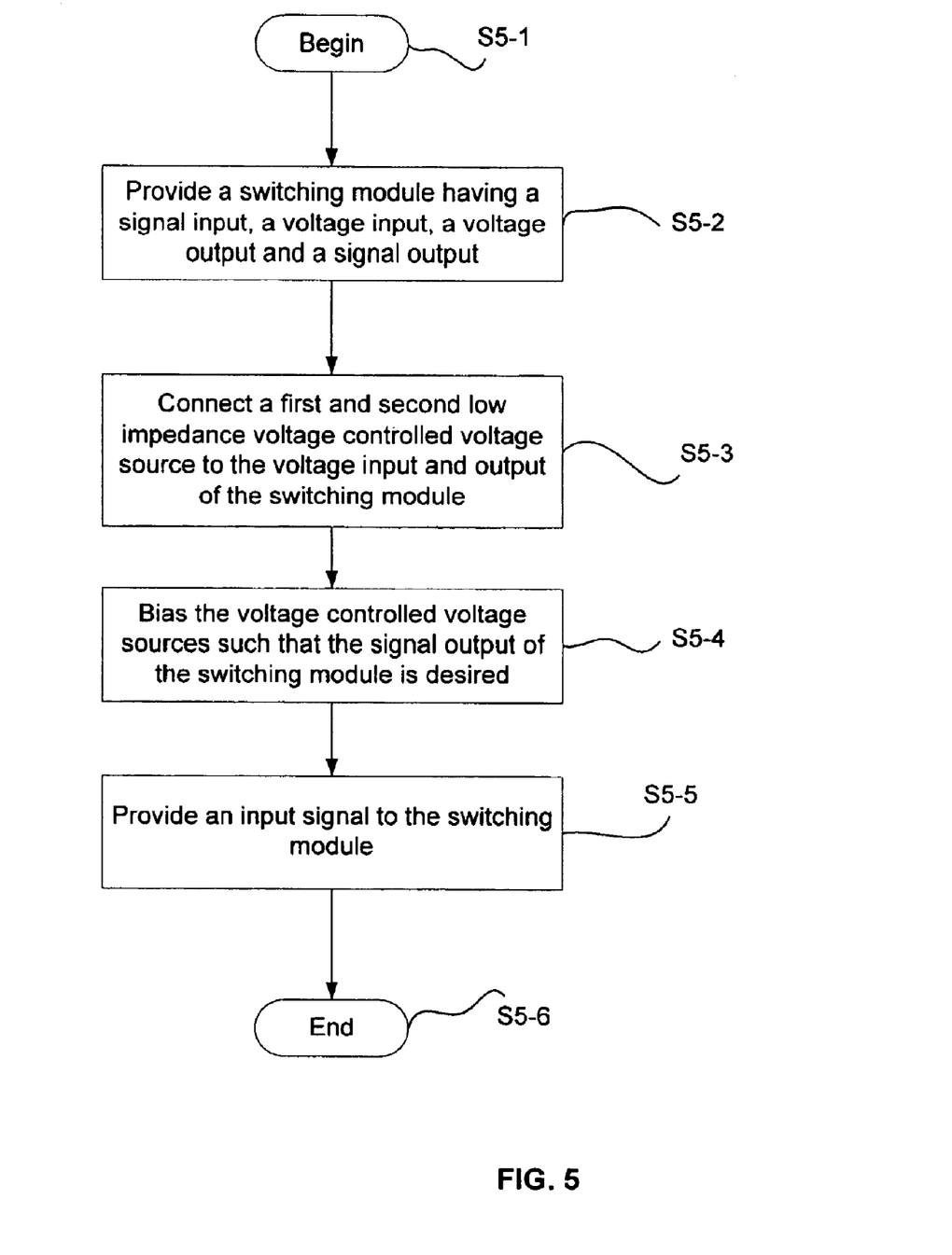
FIG. 5 is a flowchart of a method for driving a signal according to the present invention.

FIG. 5 is a flowchart of a method for driving a signal according to an embodiment of the present invention. The process begins at step S5-1. At step S5-2, a switching module is provided, such as described above. The switching module may be implemented via MOS transistors. The switching module may include a voltage input and output, and a signal input and output. The voltage input is connected to the switches in order to flow a current to the signal output. The switching module may be configured to receive an input signal and switch the switches to produce a signal output based on the signal input. The switching module may be configured for LVDS applications and may have built-in termination resistors as described above.

Next, at step S5-3, low impedance, voltage controlled voltage sources are provided at the voltage input and output of the switching module. Voltage controlled voltage sources may be as already described above and may include source followers.

Next, at step S5-4, the voltage controlled voltage sources are biased for the application of the driver. The biasing of the voltage controlled voltage sources can be done by a bias generator or other circuit, and may be implemented in accordance with the above-described embodiments. For LVDS applications, the biasing of the circuit should take into consideration the desired output voltage and current of the switching module, as well as all the characteristics of the source followers and the switches themselves.

Next, at step S5-5, an input signal may be provided. The input signal may be input via an input circuit to each switch, as already described above. Depending upon the configuration of the switches, the input signal may be inverted, pulled-up or pulled-down. The voltage controlled voltage source and the switching module are configured, as described above, to generate a high speed output signal based up the input signal. This output signal may be in compliance with LVDS standards.

One having ordinary skill in the art will understand that these method steps may be performed in different orders to accomplish the same result.

Embodiments of the present invention may be drawn to differential drivers such as LVDS drivers that can operate at high speed with less power because it operates with a reduced voltage swing. Due to the reduced voltage swing, which allows the LVDS driver to operate at high speeds, less parallelism is needed. Also with the differential outputs, a receiver can reject ambient common mode noise and system reflection noise. However, performance can vary significantly for LVDS drivers of different designs. Two important parameters to consider are operation frequency and power consumption.

Although the invention has been described based upon these preferred embodiments, it would be apparent to those of skilled in the art that certain modifications, variations, and alternative constructions would be apparent, while remaining within the spirit and scope of the invention. In order to determine the metes and bounds of the invention, therefore, reference should be made to the appended claims.

For example, VCVS 210 and 211 may include an operational amplifier, and the impedance of the drive my be controlled by adding an extra termination resistor Rtt. In this case, the loop gain of the opamp and of transistor 300 or 301, can be large, and the impedance can be very low. In this case, the output impedance is dominated by Rtt, and Rtt may be set close to 50 ohms to get good termination.

Furthermore, other active devices, such as BJTs or BiCMOS transistors may be used. In this case, transistor 300 could be an NPN transistor with the emitter connected to Vhigh, and transistor 301 may be a PNP transistor with the emitter connected to Vlow.

We claim:

1. A differential driver comprising:

a switching module having a plurality of switches each controlled by an input signal, a first voltage input and a second voltage input;

a first source follower circuit connected to said first voltage input; and a second source follower circuit connected to said second voltage input;

wherein said switching module outputs an output signal having an output voltage and current controlled by said first and second voltage controlled voltage sources.

2. The differential driver as recited in claim 1, further comprising:

a bias generator connected to a first bias input of said first source follower circuit and a second bias input of said source follower circuit, said bias generator outputting a first bias voltage to said first bias input and a second bias voltage to said second bias input, said first and second bias voltage adjusting said output voltage and current controlled by said first and second source follower circuits.

3. The differential driver as recited in claim 2, wherein said first bias voltage and said second bias voltage are set so that said output voltage and current are within a LVDS range.

4. The differential driver as recited in claim 1, wherein at least one switch of said plurality of switches is turned ON by said input signal input and at least one switch of said plurality of switches is turned OFF by said input signal, said at least one switch of said plurality of switches being turned ON connecting said first voltage input with said signal output.

5. The differential driver as recited in claim 1, wherein said plurality of switches comprise a plurality of transistors, at least one first transistor receiving said input signal at a gate thereof, switching said first transistor ON, and at least one second transistor receiving said input signal inverted switching said second transistor OFF.

6. The differential driver as recited in claim 1, wherein said switching module comprises a first and second pair of transistors, a first transistor of said first pair having a source connected to a source of a first transistor of a second pair, a second transistor of said first pair having a drain connected to a drain of said first transistor of said first pair, a second transistor of said second pair having a drain connected to a drain of said first transistor of said first pair, said first transistor of said first pair having a drain connected to said first voltage input, said first transistor of said second pair having a drain connected to said first voltage input, said second transistor of said first pair having a source connected to said second voltage input, said second transistor of said second pair having a source connected to said second voltage input, said first transistor of said first pair and said second transistor of said second pair each having a gate connected to a first signal input receiving said input signal, said first transistor of said second pair and said second transistor of said first pair each having a gate connected to a second signal input receiving said input signal inverted, a first signal output is connected to the drain of said second transistor, a second signal output is connected to the drain of said first transistor, said first pair of transistors being ON and said second pair of transistors being OFF when said input signal is a positive signal, and said first pair of transistors being OFF and said second pair of transistors being ON when said input signal is a negative signal.

7. The differential driver as recited in claim 6, wherein said first transistor of said first pair of transistors and said first transistor of said second pair of transistors are a first type of transistor, said second transistor of said first pair of transistors and said second transistor of said second pair of transistors are a second type of transistor.

8. The differential driver as recited in claim 7, wherein said first type of transistor is a P-type transistor and said second type of transistor is an N-type transistor.

9. The differential driver as recited in claim 6, wherein said first pair of transistors have a resistivity which is substantially equal to one another, and said second pair of transistors have a resistivity which is substantially equal to one another.

10. The differential driver as recited in claim 9, wherein said first pair of transistors have a total resistivity which is substantially equal to a resistivity of a load across said first and second signal outputs, and said second pair of transistors have a total resistivity which is substantially equal to said resistivity of said load.

11. The differential driver as recited in claim 9, wherein the resistivity of said first pair of transistors when added to the resistivity of said first and second voltage controlled voltage sources which is substantially equal to a resistivity of a load across said first and second signal outputs, and the resistivity of said second pair of transistors when added to the resistivity of said first and second voltage controlled voltage sources which is substantially equal to a resistivity of a load across said first and second signal outputs.

12. The differential driver as recited in claim 1, wherein said first source follower circuit includes a first source follower transistor in a source follower configuration and a first protective resistor between a first voltage supply and a drain of said first source follower transistor, and said second source follower circuit includes a second source follower transistor in a source follower configuration and a second protective resistor between a second voltage supply and a drain of said second source follower transistor.

13. The differential driver as recited in claim 11, wherein said load is a differential load.

14. A method of driving a signal, said method comprising:

providing a switching module having a first and second voltage input and a signal input, and a signal output, said signal input being connected to a plurality of switches in order to control an operation of said switches, and said signal output being connected to said first and second voltage inputs;

providing a first source follower circuit having a first voltage output;

providing a second source follower circuit having a second voltage output;

connecting said first voltage output of said first source follower circuit to said first voltage input of said switching module; and connecting said second voltage output of said second source follower circuit to said second voltage input of said switching module.

15. The method as recited in claim 14, further comprising a step of biasing said first and second source follower circuits in order to produce an output signal at said signal output having a voltage and a current within a predetermined range.

16. The method as recited in claim 14, wherein said step of providing said first and second source follower circuits comprise providing a transistor of a first type and a transistor of a second type.

17. The method as recited in claim 16, wherein said step of providing said first and second source follower circuits comprise providing a transistor of a N-type and a transistor of a P-type.

18. The method as recited in claim 17, wherein said step of providing a switching module comprises:

providing a pair of PMOS transistors connected to said first voltage input, and a pair of NMOS transistors connected to said second voltage input;

connecting a source of said PMOS transistors to a source of said N-type transistor of said first source follower circuit;

connecting a source of said NMOS transistors to a source of said P-type transistor of said second source follower circuit;

connecting a drain of said PMOS transistors to a drain of said NMOS transistors; and connecting a gate of said NMOS and PMOS transistors each to said signal input.

19. The method as recited in claim 15, wherein said step of biasing said first and second source follower circuits includes biasing said first and second source follower circuits in order to produce an output signal at said signal output having a voltage and a current within an LVDS range.

20. The method as recited in claim 18, wherein said step of biasing said first and second source follower circuits includes biasing said first and second source follower circuits in order to produce an output signal at said signal output having a voltage and a current within an LVDS range.

21. A differential driver comprising:

a switching means for switching a plurality of switches in order to produce a signal output based on an input signal, a first and second voltage input;

a first source follower means for generating a first voltage output as said first voltage input to said switching means; and a second source follower means for generating a second voltage output as said second voltage input to said switching means.

22. The differential driver as recited in claim 21, further comprising:

a bias means for biasing said first and second source follower means to produce said first and second voltage outputs.

23. The differential driver as recited in claim 22, wherein said bias means biases said first and second source follower means to produce said first and second voltage outputs, such that said signal output of said switching means has a current and a voltage within a predetermined range.

24. The differential driver as recited in claim 23, wherein said bias means biases said first and second source follower means to produce said first and second voltage outputs, such that said signal output of said switching means has a current and a voltage within a LVDS range.

25. The differential drive as recited in claim 21, wherein said switching means includes transistor circuit means for switching a current from said first source follower means to said signal output to said second source follower means.

26. The differential driver as recited in claim 21, wherein said transistor circuit means comprising a first group of transistors configured to be switched ON when said input signal is positive, and a second group of transistors configured to be switched ON when said second signal is negative, said transistor circuit means for providing a first output signal when said input signal is positive and a second output signal when said second signal is negative.

27. The differential driver as recited in claim 26, wherein said transistor circuit means includes a built-in terminal resistance means for improving output signal integrity.

28. The differential driver as recited in claim 27, further comprising a differential load means for receiving said output of said switching circuit, wherein said built-in terminal resistance means is based on a resistivity of each transistor pair and on a resistance of said differential load.

29. The differential driver as recited in claim 26, wherein said transistor circuit means includes at least one transistor of a first type and at least on transistor of a said second type.

30. The differential driver as recited in claim 29, wherein said first type is a N-type transistor and said second type is a P-type transistor.

31. The differential driver as recited in claim 28, wherein the resistivity of said first group of transistors when added to the resistivity of said first and second source follower means which is substantially equal to a resistivity of said differential load, and the resistivity of said second pair of transistors when added to the resistivity of said first and second source follower means which is substantially equal to a resistivity of said differential load.

32. The differential driver as recited in claim 21, wherein said first source follower means includes a first protective resistor means for protecting a transistor of said first source follower means, and said second source follower means includes a second protective resistor means for protecting a transistor of said second source follower transistor.

* * * * *